Jan. 22, 1957 E. AMATNIEK 2,778,884

DIFFERENTIAL AMPLIFIER

Filed Nov. 26, 1952 2 Sheets-Sheet 1

INVENTOR
Ernest Amatniek

BY Pennie, Edmonds, Morton, Barrows and Taylor
ATTORNEYS

INVENTOR
Ernest Amatniek
BY
Pennie, Edmonds, Morton, Barrows and Taylor
ATTORNEYS

United States Patent Office 2,778,884

Patented Jan. 22, 1957

2,778,884

DIFFERENTIAL AMPLIFIER

Ernest Amatniek, New York, N. Y., assignor to Joseph Greenspan, doing business under the name and style of Process and Instruments, Brooklyn, N. Y., a sole proprietorship Application November 26, 1952, Serial No. 322,735

4 Claims. (Cl. 179—171)

This invention relates to electronic amplifiers and more particularly to amplifiers designed to amplify voltages applied out of phase between two input voltage points while rejecting or minimizing voltages applied in phase between such points and a reference point such as ground. Such amplifiers are known as difference or differential amplifiers.

The invention provides an amplifier of this type having an extremely high in-phase to out-of-phase signal rejection ratio which may be maintained over a wide range of signal frequencies. The amplifier of the invention has moreover a high input impedance and a balanced output, and the desired high rejection ratio may be maintained in spite of the replacement of tubes and other components through simple adjustments without the necessity of close selection of replacement components for matching.

The rejection ratio may be defined as the ratio of the in-phase input signal voltage to the out-of-phase input signal voltage required to produce equal in- and out-of-phase output signal voltages. With the amplifier of the invention, rejection ratios of the order of $10^4$ may be readily obtained for frequencies of the in- and out-of-phase signals from 10 C. P. S. to 10 kc./sec., and of the order of $10^5$ or better for a limited band of frequencies within this range.

Differential amplifiers are useful where it is desired to study a voltage difference (often minute) existing between two ungrounded points while at the same time another voltage, which may for example be an A. C. voltage of relatively low frequency, exists between ground and those two points. Differential amplifiers are thus useful for example in equipment for the making of biological voltage measurements such as electrocardiagraphs and electroencephalographs. Other fields of application are analogue computer amplifiers and in the isolation of channels in multiplex communication systems.

It has been proposed heretofore to employ as differential amplifiers push-pull plate-loaded amplifiers employing cathode degeneration in a single large cathode resistor to which the cathodes of both tubes are connected. The push-pull amplifier as heretofore employed however does not produce large rejection ratios, and the performance degenerates further at high frequencies.

It has also been heretofore proposed in U. S. Patent No. 2,147,940 to apply a voltage difference existing between two ungrounded points which it is desired to amplify to the control grids of two tubes having a common cathode resistor, the plate of the first tube being connected to B+ and the second tube having a plate load across which the amplified difference between the input voltages is obtained in a single-ended output. By properly choosing the magnitude of the cathode resistor with respect to the internal plate resistance of the first tube and the amplification factors of the two tubes, it is theoretically possible to suppress completely the in-phase component so that in-phase changes in voltage between the two input leads on the one hand and ground on the other will produce no change in the voltage between the plate of the second tube and ground.

The argument for the circuit of Patent No. 2,147,940 runs as follows: If a change in the in-phase voltage component applied to the grids of the two tubes is to produce zero change in the output voltage from the plate of the second tube to ground, there can be no change in the plate current or plate voltage of the second tube with respect to ground due to the in-phase voltage applied. Therefore the amplification of the grid-cathode voltage difference applied to the second tube must be equal to the amplification factor of that tube, and the voltage change across the common cathode resistor must be due exclusively to the action of the first tube (as a cathode follower). The grid-to-cathode voltage, $e_{g2}$ say, is the difference between the impressed in-phase voltage change, E say, and the change in voltage across the common cathode resistor, which may be written as $kE$, $k$ being the gain of the first tube as a cathode follower. Then $e_{g2}=E(1-k)$. This results in an amplified plate-cathode voltage $e_{p2}$ of the second tube: $e_{p2}=-\mu_2E(1-k)$, $\mu_2$ being the amplification factor of the second tube. Since the change in the plate-to-ground voltage of the second tube due to the in-phase voltage component is to be zero, the change in voltage across the common cathode resistor must be equal and opposite to the plate to cathode voltage change of the second tube. Therefore $kE=\mu_2E(1-k)$ or $k=\mu_2/(\mu_2+1)$. This gives a relation between the amplification factor of the second tube and the gain of the first tube as a cathode follower, which gain is a function of the amplification factor of the first tube, of its internal plate resistance and of the magnitude of the cathode resistor.

In practice the circuit of Patent No. 2,147,940 just described has a number of disadvantages. The grid-to-ground input impedances of its tubes are unequal and are undesirably low, especially for applications, common in the biological field, where the signals are derived over series paths having very high resistance. Due to its unbalanced construction the circuit is sensitive to power supply voltage variations. Even without such variations the amplification factors of its two tubes are unequal and change in different ways with the in-phase input signal to be suppressed so that their changes do not tend to cancel. Moreover the circuit has a single-ended output in which the in-phase component, to the extent that it has not been suppressed, is inextricably mixed with the out-of-phase component. It is therefore impossible to add another differential amplifier in cascade in order further to reduce the relative magnitude of the in-phase component compared to the out-of-phase component.

The present invention provides a differential amplifier which is substantially free from these shortcomings. It is characterized by a very high input impedance, by low sensitivity to power supply variations, and by relative insensitivity to changes in parameters due for example to replacement of tubes. The circuit is completely symmetric and has both balanced input and output connections.

According to the invention, two stages of push-pull amplification are employed with cathode degeneration in the first and with means to transmit a portion of the in-phase signal component from the first stage to the second without interfering with the transmission of substantially all of the out-of-phase component from the first stage to the second. The first stage is cathode-loaded, the second stage plate-loaded, and the cathodes of the second stage are coupled into the cathode circuit of the first stage at a point (or at two symmetrically disposed points) between the cathodes of the first stage and B—. With this arrangement, in the case of the out-of-phase component the full output voltage of the cathode follower input stage is impressed between the grids and cathodes of the second stage, so that the cathode follower input stage introduces a very small loss in the overall gain of the amplifier while providing a high input impedance thereto.

In the case of the in-phase component of the signal, the output of the first stage is split into two parts, the larger being between the coupling point or points above referred to and ground and the smaller part being between that coupling point or points and the cathodes of the first stage. This smaller part is impressed between the grids and cathodes of the second stage where it is amplified and made equal in magnitude but opposite in sign to the larger part. These two signals are made to cancel each other so that the in-phase component is completely suppressed.

The invention will now be described in detail in terms of a number of preferred embodiments with reference to the accompanying drawings in which:

Fig. 1 is a schematic diagram of one embodiment of the invention;

Fig. 1*a* is a simplified diagram representing the equivalent circuit of the embodiment of Fig. 1 for the out-of-phase component of the input signal to Fig. 1;

Fig. 1*b* is a simplified diagram representing in one form the equivalent circuit of the embodiment of Fig. 1 for the in-phase component of the input signal to Fig. 1;

Fig. 1*c* is a further simplified diagram representing the equivalent circuit of the embodiment of Fig. 1 for the in-phase component of the input signal to Fig. 1;

Figures 3, 4, 4A, 4B, 4C, 5, 6, 7:
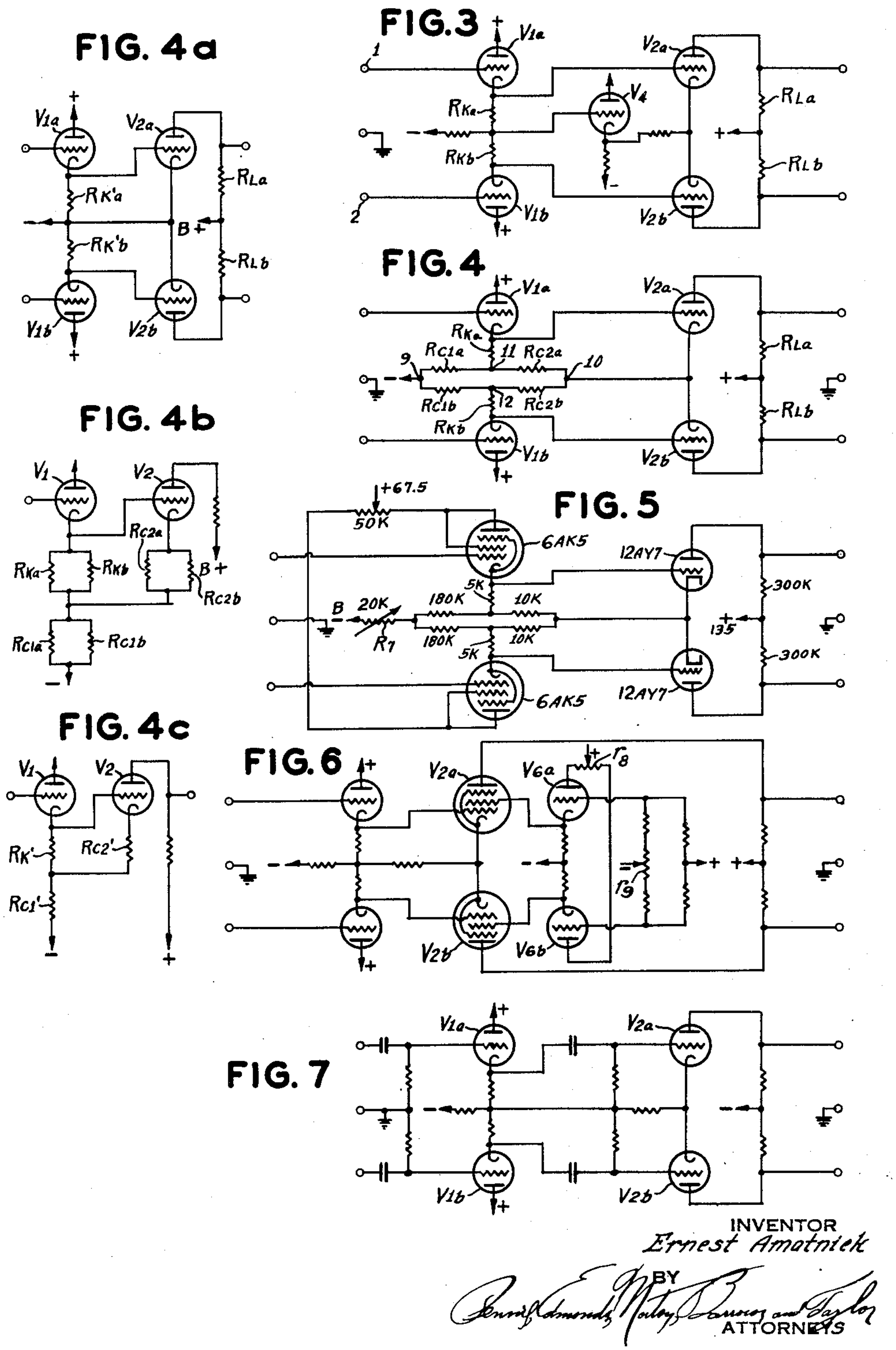
Fig. 3 is a schematic diagram of another embodiment of the invention employing a cathode follower coupling between the junction of the cathode loads in the first stage and the cathodes of the second stage.
Fig. 4 is a schematic diagram of another embodiment of the invention illustrating a modified arrangement of elements for in-phase signal proportioning in the first stage and for voltage coupling between the junction of the cathode loads in the first stage and the cathodes of the second stage.

Fig. 4*a* is a simplified diagram representing the equivalent circuit of the embodiment of Fig. 4 for the out-of-phase signal component;

Figs. 4*b* and 4*c* are simplified diagrams representing the equivalent circuit of the embodiment of Fig. 4 for the in-phase signal component;

Fig. 5 is a schematic diagram of an embodiment of the invention illustrating component values in a circuit according to the invention which has been successfully built and operated;

Fig. 6 is a schematic diagram of another embodiment of the invention employing pentode tubes in the second stage together with means for altering the amplification factors and D. C. output levels of the tubes of that stage by adjustment of the screen grid voltages and their supply source impedance; and Fig. 7 is a schematic diagram of a further embodiment of the invention employing A. C. signal coupling only.

Similar reference characters have been used throughout the drawings to designate elements having similar functions. Except however as to Figs. 1 to 1*c* and, separately, as to Figs. 4 to 4*c*, similarity of reference characters does not connote identity of component values as between different figures.

Figure 1:
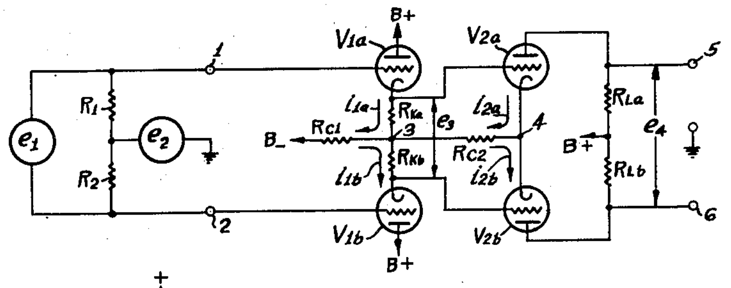

In Fig. 1, two triode amplifier tubes $V_{1a}$ and $V_{1b}$ have their grids connected to input terminals 1 and 2 and their plates to B+. Their cathodes are connected through load resistors $R_{ka}$ and $R_{kb}$ to a junction point 3 which is returned to ground through a common resistor $R_{c1}$ and through the negative side B− of the power supply. The symbol $R_{c1}$ is however to be understood as including the resistance of the negative side of the power supply to ground as well as that of the resistor shown in the figure. $V_{1a}$ and $V_{1b}$ are tubes of the same type and ideally should have identical characteristics. The load resistors $R_{ka}$ and $R_{kb}$ are moreover equal. The cathodes of $V_{1a}$ and $V_{1b}$ are connected to the grids of $V_{2a}$ and $V_{2b}$ respectively, another pair of triodes ideally identical to each other. The junction 4 of the cathodes of $V_{2a}$ and $V_{2b}$ is linked to the junction 3 through a resistor $R_{c2}$. The plates of $V_{2a}$ and $V_{2b}$ are connected to a source of positive plate potential through equal load resistors $R_{La}$ and $R_{Lb}$. The output terminals 5 and 6 connect respectively to the plates of $V_{2a}$ and $V_{2b}$. The signal voltage at the input terminals 1 and 2 is shown in the figure as comprising a desired out-of-phase component $e_1$ and an undesired in-phase component $e_2$. The response of the circuit to these two signal voltage components will be analyzed in terms of Figs. 1*a*, 1*b* and 1*c*. The in-phase component is shown as delivered through equal resistors $R_1$ and $R_2$ in order that the generator of $e_1$ may not appear to be short-circuited. The loss of $e_2$ in $R_1$ and $R_2$ is to be neglected in the following analysis: The elements to the left of the terminals 1 and 2 form no part of the present invention and are indicated in the drawings only to clarify the concept of in-phase and out-of-phase voltages at the terminals 1 and 2.

Figure 1A:
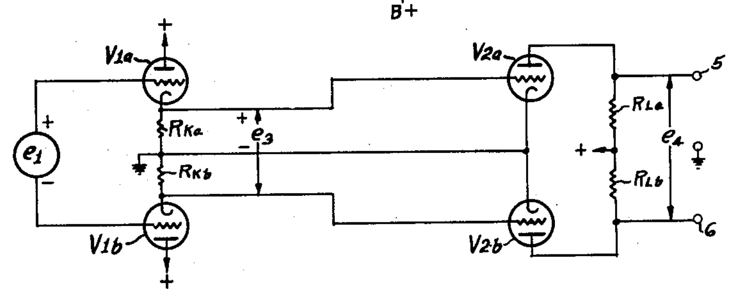

Considering first the out-of-phase voltage $e_1$, one-half of $e_1$ appears in one polarity between the grid of $V_{1a}$ and ground, and the other half appears in the opposite polarity between the grid of $V_{1b}$ and ground. In view of the symmetry of the circuit in the junction points 3 and 4, the out-of-phase signals so applied to tubes $V_{1a}$ and $V_{1b}$ result in equal and opposite changes of plate current $i_{1a}$ and $i_{1b}$ flowing through the load resistors $R_{ka}$ and $R_{kb}$. In the same way equal and opposite changes $i_{2a}$ and $i_{2b}$ are produced in the plate currents of tubes $V_{2a}$ and $V_{2b}$, with zero net change in the IR drop through the biasing resistor $R_{c2}$ which is inserted in the lead connecting junctions 3 and 4. Consequently there is no net change in IR drop across the resistors $R_{c1}$ and $R_{c2}$. Consequently for analysis of its response to the out-of-phase signal component $e_1$, the circuit of Fig. 1 can be replaced by the equivalent circuit of Fig. 1*a*, in which $V_{1a}$ and $V_{1b}$ appear connected in the customary cathode follower arrangement. The gain of the first stage of the circuit of Fig. 1*a* is given by the expression $$A_1=\frac{e_3}{e_1}=\frac{y_2e_3}{y_2e_1}=\frac{1}{1+\frac{1}{\mu_1}+\frac{R_{p1}}{\mu_1R_{ka}}}$$

in which $\mu_1$ is the amplification factor of each of the tubes $V_{1a}$ and $V_{1b}$, and $R_{p1}$ is the internal plate resistance of each of $V_{1a}$ and $V_{1b}$.

Of the voltage $e_3$ appearing between the cathodes of $V_{1a}$ and $V_{1b}$, equal halves appear in opposite polarity between the grids and cathodes of $V_{2a}$ and $V_{2b}$. As previously explained, the current changes through the tubes of the second stage are equal and opposite. The gain of the second stage is given by the expression:

$$A_2=\frac{e_4}{e_3}=\frac{y_2e_4}{y_2e_3}=\frac{\mu_2R_{La}}{R_{p2}+R_{La}}$$

In this expression $\mu_2$ and $R_{p2}$ are respectively the amplification factor and internal plate resistance of each of $V_{2a}$ and $V_{2b}$. For the out-of-phase signal component therefore the gain of the amplifier of Fig. 1 is the product of the gains of its stages or:

$$A=A_1\cdot A_2=\frac{1}{1+\frac{1}{\mu_1}+\frac{R_{p1}}{\mu_1R_{ka}}}\cdot\frac{\mu_2R_{La}}{R_{p2}+R_{La}}$$

Since the gain of the cathode follower stage of $V_{1a}$ and $V_{1b}$ is close to unity when $\mu_1$ and $R_{ka}$ are large, the gain for the complete amplifier for out-of-phase signals is approximately $$A \cong \frac{\mu_2 R_{La}}{R_{p2}+R_{La}}$$

Figure 1B:
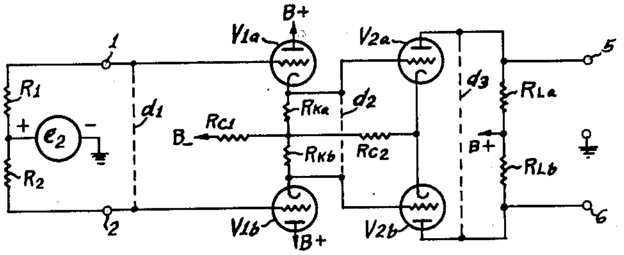
Figure 1C:
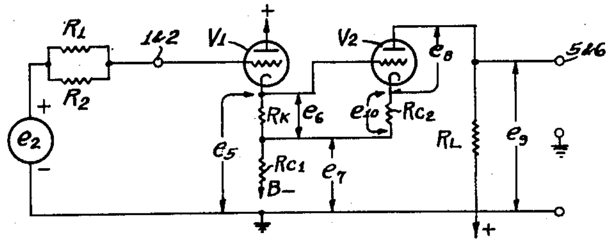

The response of the circuit of Fig. 1 to the in-phase component $e_2$ of the input signal may be analyzed in terms of Figs. 1*b* and 1*c*. Since the in-phase component $e_2$ is applied to the grids of $V_{1a}$ and $V_{1b}$ in the same polarity, these grids can for purposes of analysis be short-circuited together as indicated by the dotted line connection $d_1$ in Fig. 1*b*. Because of the symmetry of the circuit previously described, the voltages on the cathodes of $V_{1a}$ and $V_{1b}$ and the voltages on the plates of $V_{2a}$ and $V_{2b}$ due to the in-phase signal component will also be respectively identical, and these points can likewise be short-circuited together as indicated by the dotted line connections $d_2$ and $d_3$. For the in-phase component of the signal therefore the tubes $V_{1a}$ and ($V_{1b}$ operate in parallel, and the tubes $V_{2a}$ and $V_{2b}$ likewise operate in parallel. The equivalent circuit of Fig. 1*b* can therefore be redrawn in the form shown in Fig. 1*c*, with suitable changes in the values of the cathode load resistor of the first stage and plate resistor of the second stage. Thus the cathode load resistor $R_k$ of Fig. 1*c* is equal in value to the parallel resistance of resistors $R_{ka}$ and $R_{kb}$ of Fig. 1, i. e. $R_{ka}/2$. Similarly the plate load resistor $R_L$ of Fig. 1*c* is equal in value to $R_{La}/2$. $R_{c1}$ and $R_{c2}$ remain unchanged in value. $V_1$ represents tubes $V_{1a}$, $V_{1b}$ in parallel, and $V_2$ represents tubes $V_{2a}$ and $V_{2b}$ in parallel.

For suppression of the in-phase component of the signal, it is desired that the output signal voltage $e_9$ of Fig. 1*c* be identically equal to zero. This does not of course mean that the plate of $V_2$ is at ground potential. It means only that the plate of $V_2$ (and hence the plates of $V_{2a}$ and $V_{2b}$ of Fig. 1) are not to change in voltage upon the application of an in-phase voltage to the grids of $V_{1a}$ and $V_{1b}$. This condition requires that the plate current through the load resistor $R_L$, through the tube $V_2$ and through the cathode bias resistor $R_{c2}$ of the second stage remain constant. Accordingly the voltage change $e_{10}$ across $R_{c2}$ due to the input signal $e_2$ must be zero, and the voltage change $e_6$ across the cathode load resistor $R_k$ of $V_1$ is therefore equal to the grid-to-cathode voltage change in $V_2$. By definition of amplification factor, the plate-to-cathode voltage change $e_8$ of $V_2$ with no change in plate current is equal to the product of the amplification factor of that tube and its grid-to-cathode voltage change. Therefore:

$$e_8 = -\mu_2 e_6$$

But since $e_9$ is to be equal to zero, the voltage change $e_7$ across the bias resistor $R_{c1}$ of the first stage must be equal and opposite to the plate-to-cathode voltage $e_8$. Accordingly $$e_7 = -\mu_2 e_6$$

Therefore $$\frac{R_k}{R_{c1}} = \frac{e_6}{e_7} = \frac{e_6}{\mu_2 e_6} = \frac{1}{\mu_2} = \frac{R_{ka}}{2R_{c1}}$$

or $$\mu_2 = 2\frac{R_{c1}}{R_{ka}}$$

Thus referring to Fig. 1, when the cathode load resistors of the first stage are related to the resistance between the junction point 3 of the cathodes of the first stage and ground as two is to the amplification factor of the tubes of the second stage, complete suppression of the in-phase component of the applied signal voltage will result.

Figure 2:
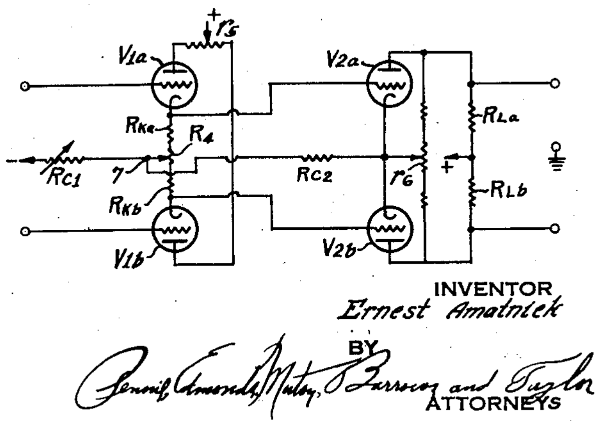
Fig. 2 is an embodiment of the invention similar to that of Fig. 1 but including a number of controls which may be used to balance the amplifier of Fig. 1 in order to compensate for imperfect symmetry in the components thereof and to adjust for changes in tubes and components so that substantially complete suppression of the in-phase signal component may be effected.

The analysis of the circuit of the invention so far given assumes identity of $V_{1a}$ with $V_{1b}$, of $R_{ka}$ with $R_{kb}$, of $V_{2a}$ with $V_{2b}$ and of $R_{La}$ with $R_{Lb}$, i. e. symmetry of the circuit in a "mirror plane" defined by the junctions of the cathode circuits in the first and second stages, and that these elements are linear. In practice this condition of symmetry is difficult or impractical to achieve, particularly as it may be necessary from time to time to replace one or more of the tubes employed. The invention however provides means whereby compensation may readily be made both for departure of the two halves of the circuit from symmetry and for variation in the amplification factors and other parameters of the tubes of the second stage, whether identical to each other or not. Fig. 2 illustrates a number of possibilities for compensation in this regard. By making variable the common cathode resistor $R_{c1}$ of the first stage, the circuit may be adjusted to fit the average value of the amplification factors of the two tubes of the second stage for suppression of the in-phase signal component in accordance with the criterion $$\mu_2 = 2R_{c1}/R_{ka}$$

If the tubes of either or both of the pairs $V_{1a}$, $V_{1b}$ and $V_{2a}$, $V_{2b}$ are mismatched as to amplification factor, plate resistance or other parameters, this can be compensated for in a number of ways. The plates of $V_{1a}$ and $V_{1b}$ can for example be returned to B+ through a potentiometer $r_5$, adjustment of which alters the plate resistances and the gains of those tubes in opposite directions. The same effect may be achieved by transforming the junction point 3 of Fig. 1 into a tap 7 on a potentiometer $R_4$ connected between the cathode load resistors $R_{ka}$ and $R_{kb}$. The two portions of $R_4$ are then of course to be reckoned into the values of $R_{ka}$ and $R_{kb}$ of this circuit. The amplification factors of $V_{2a}$ and $V_{2b}$ can be directly changed in opposite senses by means of a potentiometer $r_6$ connected between their plates and with its tap returned to their cathodes.

In general it is desirable to provide the circuit with one adjustment of each of these types, namely one adjustment compensating for unbalance or lack of symmetry in the circuit, and another to adjust for suppression of the in-phase signal component, assuming symmetry be achieved. The adjustments are easily made in practice by observing the in-phase component between either of the output terminals 5 or 6 and ground on an oscilloscope.

Figs. 3–7 illustrate a number of other embodiments of my invention. In Fig. 3 the junction of the cathode load resistors of the first stage is coupled to the cathodes of the output stage by means of a cathode follower-connected tube $V_4$. This improves rejection of the in-phase signal component when it appears at higher frequencies and permits greater latitude in selection of the steady-state conditions in the tubes of the two stages.

In the embodiment of Fig. 4 the common cathode return $R_{c1}$ of Fig. 1 has been replaced by two equal separate resistors $R_{c1a}$ and $R_{c1b}$ whose parallel resistance is equal to that of $R_{c1}$ of Fig. 1, assuming of course the other parameters to be unchanged. Similarly the biasing resistor $R_{c2}$ of Fig. 1 is replaced in Fig. 4 by two equal separate resistors $R_{c2a}$ and $R_{c2b}$ having for otherwise equal parameters a parallel resistance equal to that of $R_{c2}$ of Fig. 1. This circuit again gives more freedom in the choice of the other components.

The equivalence of the circuit of Fig. 4 to that of Fig. 1 as regards suppression of the in-phase component of the input signal will be explained with reference to Figs. 4*a*, 4*b* and 4*c*. As to the out-of-phase component of the input signal, the current changes through $R_{c1a}$ and $R_{c1b}$ are equal and opposite, and the current changes through $R_{c2a}$ and $R_{c2b}$ are equal and opposite for the same reasons that the current changes $i_{1a}$, $i_{1b}$ and $i_{2a}$, $i_{2b}$ of Fig. 1 are equal. The points 9 and 10 are therefore unaffected in potential by the out-of-phase signal component, and may be considered as short-circuited together, just as in analysis of the embodiment of Fig. 1 for the out-of-phase component the resistor $R_{c1}$ and $R_{c2}$ were short circuited in the equivalent circuit of Fig. 1*a*.

As to the out-of-phase component therefore the circuit of Fig. 4 can be replaced by that of Fig. 4*a*, in which the resistor $R_{k'a}$ and $R_{k'b}$ have the value $$R_{k'a}=R_{k'b}=R_{ka}+\frac{R_{c1a}R_{c2a}}{R_{c1a}+R_{c2a}}$$

The gain of the first stage in Fig. 4 is therefore $$A_1=\frac{1}{1+\frac{1}{\mu_1}+\frac{R_{p1}}{\mu_1+R_{k'a}}}$$

$\mu_1$ and $R_{p1}$ referring respectively to the amplification factor and internal plate resistance of the tubes of the first stage in Fig. 4. The over-all gain of the circuit of Fig. 4 is again approximately $$A=\frac{\mu_2 R_{La}}{R_{p2}+R_{La}}$$

If in fact $R_{ka}$ and $R_{kb}$ of Fig. 4 are of the same value as the similarly identified elements of Fig. 2, the first stage of Fig. 4 will have a higher gain than the first stage of Fig. 1.

As to the in-phase signal, the tubes $V_{1a}$, $V_{1b}$ and $V_{2a}$, $V_{2b}$ of Fig. 4 act in parallel as in the case of Fig. 1, and points 11 and 12 will be brought to the same potential. Accordingly the circuit of Fig. 4 may be redrawn for the in-phase component as Fig. 4*b*. Fig. 4*b* when simplified as shown in Fig. 4*c* is of the same form as the circuit shown in Fig. 1*c* to illustrate the response of the circuit of Fig. 1 to the in-phase voltage component. In Fig. 4*c*

$$R_{k'}=\frac{R_{ka}R_{kb}}{R_{ka}+R_{kb}}=\frac{R_{ka}}{2}$$

and $$R_{c1'}=\frac{R_{c1a}R_{c1b}}{R_{c1a}+R_{c1b}}=\frac{R_{c1a}}{2}$$

$$R_{c2'}=\frac{R_{c2a}R_{c2b}}{R_{c2a}+R_{c2b}}=\frac{R_{c2a}}{2}$$

Accordingly, the circuit of Fig. 4 will also effect suppression of the in-phase component. In terms of Fig. 4*c* the condition here is that $\mu_2=R_{c1'}/R_{k'}$ and in terms of Fig. 4: $\mu_2=R_{c1a}/R_{ka}$.

Fig. 5 illustrates an embodiment of the invention generally similar to that of Fig. 4 but illustrating actual component values. Trimmer capacitors for the compensation of stray capacities have not been shown. Adjustment for asymmetry is obtained by means of a potentiometer in the connection from the plates of the first stage tubes to B+, and adjustment for suppression of the in-phase signal is provided for by means of a variable resistor in the common return of the cathodes of those tubes. The tubes of the first stage are pentodes connected as triodes.

Fig. 6 illustrates an embodiment employing pentode tubes in the second stage. Pentodes have the advantage of providing high gain. As a means of adjusting for variations in the amplification factors of these tubes, a pair of cathode follower connected tubes $V_{6a}$ and $V_{6b}$ are provided for generation of the screen grid voltages employed in the pentode tubes $V_{2a}$ and $V_{2b}$ of the second stage. A potentiometer $r_9$ connected to alter the control grid voltages of $V_{6a}$ and $V_{6b}$ in opposite directions changes the screen grid voltages and the D. C. output levels. Adjustment of the series plate potentiometer $r_g$, by its effect on the plate currents of tubes $V_{6a}$ and $V_{6b}$, changes the screen supply impedances of the second stage tubes $V_{2a}$ and $V_{2b}$ in opposite directions in order to equalize the amplification factors of those tubes.

While the invention is for many applications preferably embodied in D. C. coupled amplifiers as illustrated in Figs. 1–6, it is also useful in A. C. amplifiers where the in-phase voltage component may be of a frequency too high to be blocked out by coupling condensers or where D. C. response is not desired. An embodiment of the invention as applied to an A. C. amplifier is illustrated in Fig. 7.

I claim:

1. A balanced two-stage electronic amplifier comprising two cathode follower-connected input tubes having their cathode loads returned to a point of fixed potential through substantially equal resistances, two plate loaded output tubes having their cathodes connected together and coupled to points in the cathode circuits of said input tubes separated by equal resistances from said point of common potential, voltage coupling means between the cathodes of said input tubes and the grids of said output tubes, the ratio of the resistance between the cathode of each of said input tubes and each of said points of equal resistance to the resistance between each of said points of equal resistance and said point of fixed potential being substantially equal to the reciprocal of the amplification factor of each of said output tubes.

2. A differential electronic amplifier comprising two substantially identical cathode-loaded electron discharge tubes each having a cathode, control grid and anode, said tubes being connected in push-pull relation, a common source of anode voltage for said tubes, substantially equal resistances between each of said cathodes and the negative terminal of said source, two substantially identical anode-loaded electron discharge tubes each having a cathode, control grid and anode, separate signal coupling means connected between the cathodes of said cathode-loaded tubes and the grids of said anode-loaded tubes, and two coupling means connected each between the cathode of one of said anode-loaded tubes and a point in the cathode circuit of one of said cathode-loaded tubes, said points being so selected that the ratio of the resistance between the cathode of each of said cathode-loaded tubes and the one of said points in its cathode circuit to the parallel resistance between both of said points and said terminal is substantially equal to two divided by the amplification factor of either of said anode-loaded tubes.

3. A differential electronic amplifier comprising two substantially identical cathode-loaded electron discharge tubes each having a cathode, control grid and anode, said tubes being connected in push-pull relation, a common source of anode voltage for said tubes, substantially equal resistances between each of said cathodes and the negative terminal of said source, two substantially identical anode-loaded electron discharge tubes each having a cathode, control grid and anode, separate signal coupling means connected between the cathodes of said cathode-loaded tubes and the grids of said anode loaded tubes, and two coupling means connected each between the cathode of one of said anode loaded tubes and a point in the cathode circuit of one of said cathode-loaded tubes, said points being so selected that the ratio of the parallel resistance between the cathodes of said cathode-loaded tubes and the said points to the parallel resistance between the said points and the said negative terminal is substantially equal to the reciprocal of the amplification factor of either of said anode-loaded tubes.

4. A differential electronic amplifier comprising two substantially identical cathode-loaded electron discharge tubes each having a cathode, control grid and anode, said tubes being connected in push-pull relation, a common source of anode voltage for said tubes, substantially equal resistances between each of said cathodes and the negative terminal of said source, two substantially identical anode-loaded electron discharge tubes each having a cathode, control grid and anode, separate signal coupling means connected between the cathodes of said cathode-loaded tubes and the grids of said anode-loaded tubes, and two coupling means connected each between the cathode of one of said anode-loaded tubes and a point in the cathode circuit of one of said cathode-loaded tubes, said points being so selected that the ratio of the parallel resistance between the cathode of said cathode-loaded tubes and the said points to the parallel resistance between the said points and the said negative terminal is substantially equal to the reciprocal of the average of the amplification factors of said anode-loaded tubes.

References Cited in the file of this patent

UNITED STATES PATENTS

| | | |
|---|---|---|
| 2,070,071 | Stromeyer | Feb. 9, 1937 |
| 2,085,488 | Woodward et al. | June 29, 1937 |
| 2,147,940 | Toennies | Feb. 21, 1939 |
| 2,545,507 | Williams | Mar. 20, 1951 |
| 2,590,104 | King | Mar. 25, 1952 |

FOREIGN PATENTS

| | | |
|---|---|---|
| 264,142 | Switzerland | Sept. 30, 1949 |